US008275477B2

(12) United States Patent
Gallo

(10) Patent No.: US 8,275,477 B2
(45) Date of Patent: *Sep. 25, 2012

(54) METHOD AND APPARATUS FOR DISTORTION OF AUDIO SIGNALS AND EMULATION OF VACUUM TUBE AMPLIFIERS

(76) Inventor: Marc Nicholas Gallo, Bayside, NY (US)

( * ) Notice: Subject to any disclaimer, the term of this patent is extended or adjusted under 35 U.S.C. 154(b) by 411 days.

This patent is subject to a terminal disclaimer.

(21) Appl. No.: 12/462,756

(22) Filed: Aug. 10, 2009

(65) Prior Publication Data

US 2011/0033057 A1 Feb. 10, 2011

(51) Int. Cl.
*G06F 17/00* (2006.01)
*H03G 3/00* (2006.01)

(52) U.S. Cl. .......................................... 700/94; 381/61

(58) Field of Classification Search .................... 700/94; 381/61, 106; 330/109, 294
See application file for complete search history.

(56) References Cited

U.S. PATENT DOCUMENTS

| | | | | |
|---|---|---|---|---|
| 3,835,409 A | | 9/1974 | Laub | |
| 4,243,943 A | * | 1/1981 | Cherry | 330/100 |
| 4,405,832 A | | 9/1983 | Sondermeyer | |
| 4,495,640 A | | 1/1985 | Frey | |
| 4,672,671 A | | 6/1987 | Kennedy | |
| 4,710,727 A | | 12/1987 | Rutt | |
| 4,811,401 A | | 3/1989 | Brown, Sr. et al. | |
| 4,852,444 A | | 8/1989 | Hoover et al. | |
| 4,868,869 A | | 9/1989 | Kramer | |
| 4,949,177 A | | 8/1990 | Bannister et al. | |
| 4,991,218 A | | 2/1991 | Kramer | |
| 4,995,084 A | | 2/1991 | Pritchard | |
| 5,032,796 A | | 7/1991 | Tiers et al. | |
| 5,131,044 A | | 7/1992 | Brown, Sr. et al. | |
| 5,248,844 A | | 9/1993 | Kunimoto | |
| 5,321,325 A | | 6/1994 | Lannes | |
| 5,524,055 A | | 6/1996 | Sondermeyer | |
| 5,528,532 A | | 6/1996 | Shibutani | |
| 5,570,424 A | | 10/1996 | Araya et al. | |
| 5,578,948 A | | 11/1996 | Toyama | |
| 5,596,646 A | | 1/1997 | Waller, Jr. et al. | |
| 5,619,578 A | | 4/1997 | Sondermeyer et al. | |
| 5,647,004 A | | 7/1997 | Sondermeyer et al. | |
| 5,748,747 A | | 5/1998 | Massie | |
| 5,789,689 A | | 8/1998 | Doidic et al. | |
| 5,802,182 A | | 9/1998 | Pritchard | |
| 5,923,767 A | * | 7/1999 | Frindle et al. | 381/106 |
| 6,350,943 B1 | | 2/2002 | Suruga et al. | |
| 6,504,935 B1 | | 1/2003 | Jackson | |
| 6,611,854 B1 | | 8/2003 | Amels | |
| 8,065,129 B1 | * | 11/2011 | Rahmat et al. | 703/14 |
| 2006/0248518 A1 | * | 11/2006 | Kundert | 717/140 |
| 2008/0218259 A1 | | 9/2008 | Gallo | |

OTHER PUBLICATIONS

Appendix of Patent Rules.*

* cited by examiner

*Primary Examiner* — Davetta W Goins
*Assistant Examiner* — Daniel Sellers

(57) ABSTRACT

A method for digitally processing audio signals to emulate the effects of vacuum tube amplifiers and preamplifiers, musical instrument amplification systems, and distortion effects. By use of an implicit numerical method to estimate the response of a parametrically-controlled non-linear transfer function, non-linear filters, and feedback elements, the dynamic behavior and distortion effects of tube amplification stages are simulated. This provides the capability to reproduce the desired sounds of vintage and modern tube amplifier systems and effects with the conveniences and control associated with digital signal processing systems and software.

2 Claims, 7 Drawing Sheets

METHOD AND APPARATUS FOR DISTORTION OF AUDIO SIGNALS AND EMULATION OF VACUUM TUBE AMPLIFIERS

CROSS-REFERENCE TO RELATED APPLICATIONS

The following U.S. Patent documents relate to the present invention and are provided for reference.

| | | |
|---|---|---|
| 3,835,409 | September 1973 | Laub |
| 4,405,832 | September 1983 | Sondermeyer |
| 4,495,640 | January 1985 | Frey |
| 4,672,671 | June 1987 | Kennedy |
| 4,710,727 | December 1987 | Rutt |
| 4,811,401 | March 1989 | Brown Sr. et al. |
| 4,852,444 | August 1989 | Hoover et al. |
| 4,868,869 | September 1989 | Kramer |
| 4,949,177 | August 1990 | Bannister et al. |
| 4,991,218 | February 1991 | Kramer |
| 4,995,084 | February 1991 | Pritchard |
| 5,032,796 | July 1991 | Tiers et al. |
| 5,131,044 | July 1992 | Brown Sr. et al. |
| 5,248,844 | September 1993 | Kunimoto |
| 5,321,325 | June 1994 | Lannes |
| 5,524,055 | June 1996 | Sondermeyer |
| 5,528,532 | June 1996 | Shibutani |
| 5,570,424 | October 1996 | Araya et al. |
| 5,578,948 | November 1996 | Toyama |
| 5,596,646 | January 1997 | Waller Jr. et al. |
| 5,619,578 | April 1997 | Sondermeyer et al. |
| 5,647,004 | July 1997 | Sondermeyer et al. |
| 5,748,747 | May 1998 | Massie |
| 5,789,689 | January 1997 | Doidic et al. |
| 5,802,182 | September 1998 | Pritchard |
| 6,350,943 | February 2002 | Suruga et al. |
| 6,504,935 | January 2003 | Jackson |
| 6,611,854 | August 2003 | Amels |
| 11/714,289 | March 2007 | Gallo |

FIELD OF INVENTION

The present invention relates generally to audio signal processing, audio recording software, guitar amplification systems, and modeling of vacuum tubes. More particularly, the present invention concerns a signal processing method designed to distort audio signals and mimic the desired audio characteristics, dynamics, and distortion associated with vacuum tube preamplifier stages and power amplifiers.

BACKGROUND OF INVENTION

Prior attempts to emulate the effects of vacuum tubes with software-based or digital tube-modeling algorithms have either failed to fully capture the characteristics of these distortions and faithfully reproduce the dynamic and "warm" sound associated with tube amplifiers, or suffer from inefficient means of performing the computational tasks required to produce them convincingly. The effects of the cathode-connected R-C network commonly found in tube amplifier stages have been overly simplified in previous art. By use of a chain of linear filters and distortion blocks, the true non-linear dynamical behavior of tube amplifier stages is lost. Many non-linear transfer functions are described by fixed equations and lack means of adjustment of their shape, linear regions, and clipping characteristics. Furthermore, little progress has been made to simplify the non-linear functions used to distort digital signals in these algorithms to improve their computational efficiency and permit greater numbers of them to run on signal processors. While prior examples to capture the characteristics of tube amplifier stages have been successful on many grounds, they either lack the parametric control, versatility, dynamic character, guaranteed numerical stability, or computational efficiency of the present invention.

U.S. Pat. No. 4,995,084 to Pritchard (Feb. 19, 1991) relates analog circuits to vacuum tube amplifiers and discloses one of the earliest digital versions that approximate the distortion of these circuits. Clipping is achieved with a basic hard-clipping algorithm and does not address controlling the curvature of the clipping regions parametrically. No attention is given to the dynamic distortion effects of tube amplification stages or the elimination of fold-over noise.

U.S. Pat No. 6,504,935 to Jackson (Jan. 7, 2003) and U.S. Pat. No. 6,611,854 to Amels (Aug. 26, 2003) disclose transfer curves based on trigonometric functions and high-order polynomials which, although allow great versatility in control of harmonic content, take greater efforts to compute. U.S. Pat. No. 5,570,424 to Araya et al. (Oct. 29, 1996), U.S. Pat. No. 5,578,948 to Toyama (Nov. 26, 1996) and U.S. Pat. No. 6,350,943 to Suruga et al. (Feb. 26, 2002) use cubic polynomial functions that are relatively easier to compute but lack a strictly linear region and adjustment of the clipping edge.

U.S. Pat. No. 5,789,689 to Doidic et al. (Aug. 4, 1998) discloses a digital guitar amplifier utilizing several transfer functions to model vacuum tube preamplifier stages. In addition to a hard-clipping function, a fixed curve closely approximating a vacuum tube transfer characteristic is described. However, despite the accuracy of the shape of this model curve, it lacks the parametric control, dynamics, linear regions and computational simplicity of the present invention.

U.S. Pat. No. 4,868,869 to Kramer (Sep. 19, 1989) and U.S. Pat. No. 5,528,532 to Shibutanti (Jun. 18, 1996) are just two of many examples disclosing digital distortion methods implementing non-linear transfer functions using lookup tables located in digital memory. Whereas table lookup methods are extremely computationally efficient, requiring only a single memory read for each processed sample, they do not address or improve the functions with which the tables are filled, nor do they provide means for dynamic or parametric control of the table values. Also, trends for higher sampling resolutions demand lookup tables of impractically large sizes.

U.S. Patent No. 4,495,640 to Frey (Jan. 22, 1985) recognizes the importance of controlling the gain and offset bias within and between tube amplifier stages for adjustable guitar distortion and implements this in analog circuitry using operational amplifiers between vacuum tube amplifier stages.

U.S. Patent Nos. 4,811,401 and 5,131,044 to Brown et al. (Mar. 7, 1989 and July 14, 1992) demonstrate the need for frequency-dependent control of distortion and highlight, through analog means, the trend for increased forward gain for higher audible frequencies and the high-shelving filter effect. This effect is an inherent property of tube amplifier stages with cathode-connected R-C components. Whereas it is often demonstrated how to simulate this high frequency boost effect with linear filters, the linear filter approach fails to emulate the non-linear dynamical behavior resulting from the feedback effects of the cathode-connected R-C network.

U.S. Patent Application 2008/0218259 by Gallo describes an efficient method of modeling the distortion curves associated with vacuum tubes, further providing sufficient parametric control to extend this technique to various other types of distortion effects. The importance of the cathode-connected R-C network, the non-linear differential equations that describe its interaction amongst a vacuum tube preamplifier circuit, and the need of numerical methods to emulate these dynamical effects are clearly described. However, the importance of the guaranteed numerical stability provided by implicit numerical methods, and efficient techniques for implementing them to solve the non-linear dynamical equations therein described, are overlooked.

It has been demonstrated that there is a need in the art for an improved signal processing method to faithfully reproduce the desired dynamic and distortion effects associated with vacuum tube amplifiers by means of a numerically stable and efficient technique. The interest to achieve these results has been expressed many times in prior works and has been satisfied by the present invention in an efficient, simple, and readily usable form.

SUMMARY OF INVENTION

It is an object of this invention to provide a means of distortion of audio signals through a signal process.

It is a further object of this invention to recreate the desirable dynamic distortion effects of vacuum tube preamplifier and power amplifier stages by means of a digital signal process.

It is still a further object of this invention to provide a means of emulating vacuum tube preamplifier and power amplifier stages in terms of equations and algorithms that can be readily implemented in software or signal processing hardware.

It is still a further object of this invention to incorporate a plurality of said vacuum tube preamplifier and power amplifier modeling stages in conjunction with linear filters and other effects to provide a means of emulating a tube amplification system, guitar amplification system, or other musical instrument signal processor.

It is still a further object of this invention to emulate the input-output transfer characteristic curve of a vacuum tube amplifier stage by means of a non-linear transfer function.

It is still a further object of this invention to provide a means for parametric control of the shape of said non-linear transfer function to allow emulation of a variety of vacuum tube amplification stages and distortion effects.

It is still a further object of this invention to provide a means of adjusting the gain and offset of the input and output signals of said non-linear transfer function to emulate the high signal gain and bias effects of vacuum tube amplification stages and similar effects.

It is still a further object of this invention to emulate the effects of the cathode-connected R-C network of vacuum tube amplifier stages by means of a non-linear filter model incorporating a non-linear transfer function, a filter, and feedback control.

It is still a further object of this invention to provide a means of describing said non-linear filter by means of a non-linear differential equation.

It is still a further object of this invention to provide a means of solving said non-linear differential equation in real-time using an implicit step-method numerical integration solver.

It is still a further object of this invention to provide a means of an efficient implicit step-method numerical integration solver for said non-linear differential equation by application of the implicit trapezoidal numerical integration method.

BRIEF DESCRIPTION OF THE DRAWINGS

For a better understanding of the present invention, reference may be had to the following description of exemplary embodiments thereof, considered in conjunction with the accompanying drawings, in which.

DETAILED DESCRIPTION OF THE INVENTION

Figure 1:
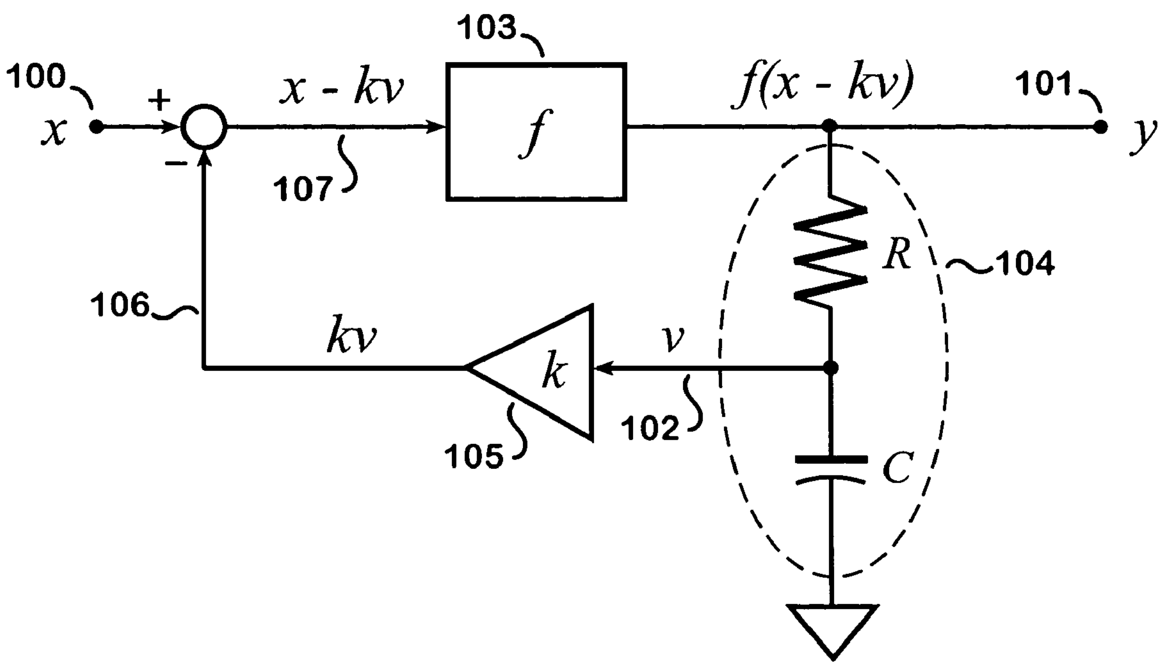
FIG. 1 is a signal flow diagram of a non-linear filter representing a model of a vacuum tube amplification stage.

Referring to FIG. 1, a signal flow block diagram of a non-linear filter representing a simplified model of a vacuum tube, featuring an input, x 100, an output, y 101, and a capacitor voltage, v 102, is shown. This non-linear filter comprises a non-linear transfer function 103, an R-C network 104, and a feedback control 105. The output signal 101 is produced by applying the non-linear transfer function 103 to the difference 107 of the input signal 100 and feedback signal 106. The feedback signal is generated by the R-C network 104, which derives its input from the output signal 101. The gain of the feedback signal is adjusted by the feedback control 105 which scales the capacitor voltage, v 102, with by the negative feedback parameter, k. This arrangement is designed to add dynamic characteristics and spectral control to the model, mimicking the same effect found in real tube amplifier stages.

The choice of values for the R-C network and feedback control parameters affect the frequency response of the amplifier stage. This is an important feature of tube amplifier stages that permits control over the balance of high-frequency distortion to low-frequency distortion. In most tube amplifiers, reduction of low frequency distortion is an inherent effect often desired to achieve a particular, popular sound. Sometimes this is accomplished through filters between tube amplifier stages, but often originates from the careful selection of component values in the cathode-connected R-C networks of each in a succession of stages. The present invention provides a means to emulate these effects.

The non-linear function block 103, located in the forward path of the system diagram, implements a parametrically-controlled non-linear transfer function. The input 107 to the non-linear function block 103, representing the grid-to-cathode voltage that determines the plate current, results from the difference of the system input signal 100, represented by x, and the feedback signal 106, represented by the product, kv. Here, signal x corresponds to the grid voltage and signal kv corresponds to the voltage across a cathode-connected R-C network, as found in typical tube amplifiers. The R-C network 104 and feedback control 105, located in the feedback loop of the system diagram, recreate the effects of the cathode-connected R-C network by generating signal kv 106 by filtering the output 101, represented by y. This entire system and signal flow diagram represent a non-linear filter that emulates the desired distortion and dynamic effects of vacuum tube amplifier stages.

Figure 2:
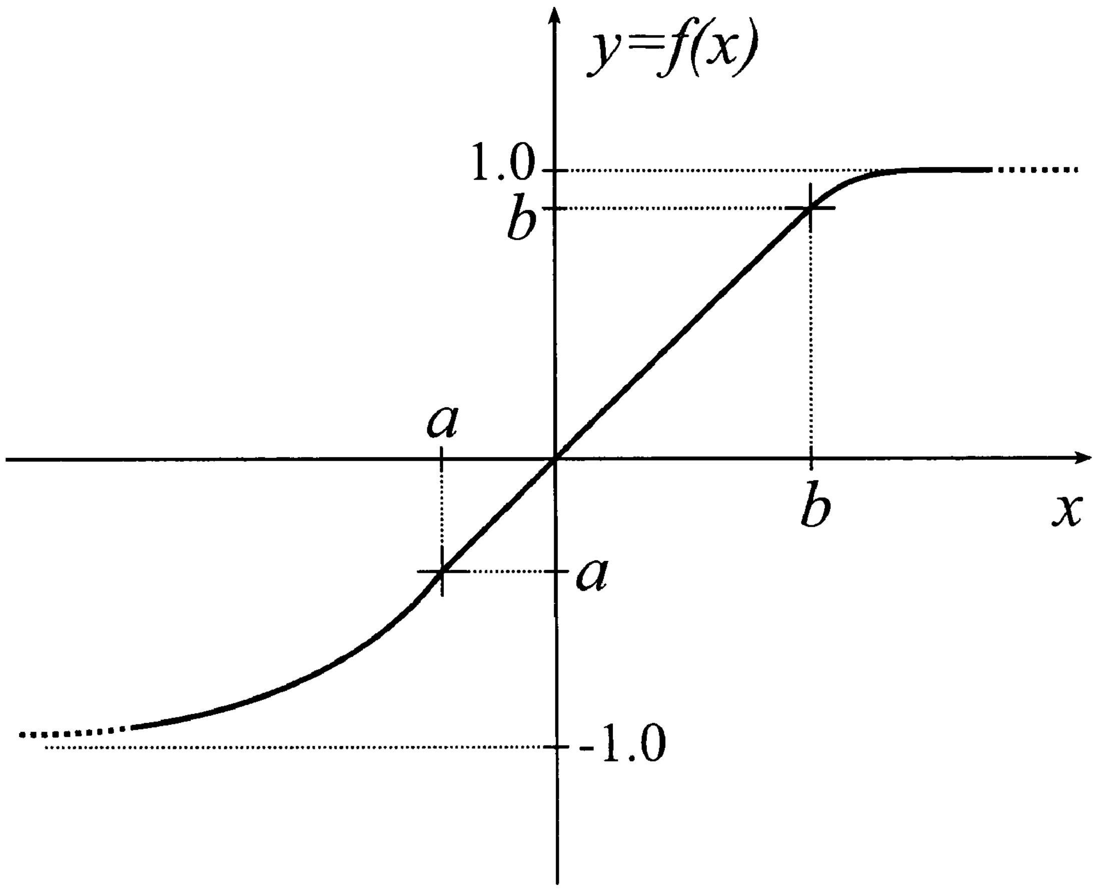
FIG. 2 is a graph of a transfer characteristic relating the input and output of the non-linear function block of a non-linear filter representing a model of a vacuum tube amplification stage.

FIG. 2 depicts the transfer characteristic relating the input and output of the non-linear function block in the forward path of the system diagram. The output of the tube model is derived from this forward transfer characteristic function, $f$, which describes the non-linear behavior of the vacuum tube. The x-axis represents the input grid voltage and the y-axis represents the output, f(x), at any given instant of time. For convenience, the axes have been scaled and shifted to center the graph about the origin and the y-axis has been inverted to reverse the inverting property of the tube amplification stage. The acceptable input signal range extends without bound from $-\infty$ to $+\infty$, while the output signal range is restricted to minimum and maximum limits. Near the origin, f(x) is mostly linear, enabling input signals of small amplitude to pass to the output mostly undistorted. Larger values of the input experience gain reduction where signal clipping and distortion results. The rate of gain reduction can be sudden or slow and is shown by the curvature of the transfer function near the output limits. Furthermore, positive half-cycles and negative half-cycles may distort asymmetrically as is shown by the transfer function's ability for a lack of odd-symmetry. The present invention incorporates these properties into this model of the transfer function.

This function is defined piecewise on three intervals $$f(x) = \begin{cases} \dfrac{(k_1 + x)}{(k_2 - x)}, & x < a \\ x, & a \le x \le b \\ \dfrac{(x - k_3)}{(x + k_4)}, & b < x \end{cases}$$

where the parameters, $k_1$, $k_2$, $k_3$, $k_4$, a, and b are chosen to control its shape and clipping characteristics. This function is divided into three regions by boundaries placed at two points, a and b. For small input signals, x lies between the boundary points, a and b, $$a \leqq x \leqq b$$

and the output, y, is simply a linear function of the input, $$y = x$$

This linear region does not distort small signals, which mimics the same effect found in tube amplifier stages. For large negative signal swings, x is less than the lower-boundary, a, $$x < a$$

and the output, y, is a non-linear function of the input, $$y = \frac{(k_1 + x)}{(k_2 - x)}$$

where $$k_1 = a^2,$$

$$k_2 = 1 + 2a$$

This function possesses a smooth horizontal asymptote at $y=-1.0$ as x decreases below a towards negative infinity. This prevents negative values of y from decreasing below a fixed saturation limit, mimicking the same effect in tube amplifier stages. The values of $k_1$ and $k_2$ are chosen to scale and shift the asymptotic non-linear section so that the transfer function and its slope remain continuous across the boundary, a. This continuity of both function and slope insures a smooth transition from the linear region to the lower clipping region, mimicking the same effect found in tube amplifier stages. Similarly, for large positive signal swings, x is greater than the upper-boundary, b, $$x > b$$

and the output, y, is another non-linear function of the input, $$y = \frac{(x - k_3)}{(x + k_4)}$$

where $$k_3 = b^2,$$

$$k_4 = 1 - 2b$$

This function possesses a smooth horizontal asymptote at $y=+1.0$ as x increases above b towards positive infinity. This prevents positive values of y from increasing above a fixed saturation limit, mimicking the same effect found in tube amplifier stages. The values of $k_3$ and $k_4$ are similarly chosen to scale and shift the asymptotic non-linear section so that the transfer function and its slope remain continuous across the boundary, b. This continuity of both function and slope insures a smooth transition from the linear region to the upper clipping region, mimicking the same effect found in tube amplifier stages.

The values of a and b may be freely chosen between $-1.0$ and $+1.0$ to produce many different types of distortions and transfer functions, both those found in tube amplifier stages, and those found in other distortion devices.

To provide additional control over the input gain and output offset, the above equation may be modified to include a gain parameter, g, and shifting parameters, o and d, as follows:

$$f(x) = \begin{cases} \dfrac{(k_1 + gx)}{(k_2 - gx)} - o, & x < \dfrac{a}{g} \\ gx + d - o, & \dfrac{a}{g} \le x \le \dfrac{b}{g} \\ \dfrac{(gx - k_3)}{(gx + k_4)} - o, & \dfrac{b}{g} < x \end{cases}$$

These improvements provide greater versatility through control over additional parameters significant to real vacuum tube preamplifier stages.

Returning to FIG. 1, the signal flow block diagram of the tube model reveals a simple relationship among the input, output, capacitor voltage, and feedback parameter:

$$y = f(x - kv)$$

For a given input, computing the output signal follows directly from the solution of the capacitor voltage. The aim, therefore, is to determine how this capacitor voltage reacts to a given input, so that the desired output may be found.

The dynamical behavior of the capacitor is described by a simple R-C network and follows that of a linear, first-order, ordinary differential equation:

$$C\frac{dv}{dt} = \frac{1}{R}(y - v)$$

Replacing y=f(x−kv) in the above equation and rearranging we obtain the expression that describes the derivative of the capacitor voltage in terms of the input, feedback parameter, and the capacitor voltage, itself:

$$\frac{dv}{dt} = \frac{1}{RC}[f(x - kv) - v]$$

Now, if the function, $f$, were simply a linear function of x and v then the solution for v, and consequently y, would be a simple matter of solving a first-order linear differential equation. However, f is not defined as a linear function by the vacuum tube model and thus requires other methods to find the solution for v. Although a general solution to this differential equation is not available, a numerical method may be used to estimate it.

To emulate this system in discrete-time sampled audio systems, a numerical method may be used to estimate the output from the previous inputs and states, sample by sample. The choice of this numerical method is critical to insure stability and accuracy and should not be made without considering complexity and computational cost. Here, the present invention discloses a method that possesses a good balance of stability, accuracy, and simplicity which allows real-time processing of signals with this vacuum tube preamplifier stage model.

The simplest method for estimating the solution to a differential equation is Euler's method, which uses the present value of the function and its derivative to estimate the next value of the function. This is done by assuming the derivative to be constant over the interval and extrapolating the function along this slope:

$$v(t+h) \approx v(t) + h\frac{dv(t)}{dt}$$

Euler's method does not preserve stability, however, and can lead to unstable numerical results when modeling stiff systems, i.e. systems that have large changes of scale in their functions for their derivatives. Such is the case for tube models which possess large variation in dynamic gain, being relatively high at the bias point, and nearly zero at the clipping regions in overdrive. For this reason, Euler's method makes for an undesirable candidate for emulating the vacuum tube model and should be avoided.

Stiff systems present stability problems for many other numerical methods as well. Whereas the overall accuracy and immunity to instability greatly improve with higher-order explicit methods, like the Runge-Kutta step methods and others, the complete preservation of system stability is simply not possible unless an implicit numerical method is used.

The simplest implicit numerical method is the Implicit Euler method. This technique is very similar to the Euler method, differing only in the location where the derivative is evaluated:

$$v(t+h) \approx v(t) + h\frac{dv(t+h)}{dt}$$

This subtle change has a great impact in the behavior of the method, introducing stability preservation, albeit at the cost of increased computational expense. Implicit methods are, generally speaking, more difficult to compute than explicit methods because their solutions can not be taken directly and are typically found through an iteratively converging process. The Implicit Euler method still remains relatively simple and easy to compute when compared to other implicit methods, though, and can be used readily. Its only drawback is that its accuracy is relatively weak in comparison to higher order explicit and implicit methods, and not very suitable for the demands of high quality audio.

Improving the accuracy of any numerical method requires reducing error terms that diminish with increasing order. However, this improvement in accuracy comes with increased computational cost, especially with implicit methods that often require multiple evaluations of the derivative function. This places practical limits to the maximum order that may be used. But, even in cases where computational expense is of no concern, there is a limit to the maximum order of a numerical method, whether implicit or explicit, for which stability remains preserved. It has been shown that an implicit method of order 4 or less is a requirement for guaranteed stability. Using implicit methods above fourth-order may result in greater accuracy, but at the expense of added vulnerability to unstable behavior. Therefore, stable candidates for solving vacuum tube models are first, second, third, and fourth-order implicit methods. First-order methods have already been discarded on the grounds of inferior accuracy. And, whereas third- and fourth-order implicit methods do exist and are numerically stable, their additional computational cost does not usually justify their increased accuracy. Second-order implicit numerical methods, however, offer a compromise between these extremes and are very efficient in estimating the response to the non-linear filter model of a vacuum tube.

A valuable second-order method, the Implicit Trapezoidal method, possesses a nice balance of accuracy, stability, and simplicity making it very desirable in simulating the tube models of interest in real-time audio processing systems. The Implicit Trapezoidal numerical integration method estimates the next value of the solution from its current value and the average of the current and next values of its derivative:

$$v(t+h) \approx v(t) + \frac{h}{2}\left(\frac{dv(t)}{dt} + \frac{dv(t+h)}{dt}\right)$$

This method preserves stability, is more accurate than the implicit Euler method, and does a well-balanced job of rendering audio simulations of the tube model.

In uniformly sampled discrete-time audio systems, functions are evaluated only at integral multiples of the sampling period, $T_S$:

$t=nT_S$ $n=1,2,3, \ldots$

It is also common to let the step size, h, equal the sampling period:

$h=T_S$

These substitutions enable us to simplify our notation and to use sequences to represent the sampled functions and their derivatives as follows:

$$v_n = v(nh) = v(nT_S)$$

-continued $$v'_n = \frac{dv(nh)}{dt} = \frac{dv(nT_S)}{dt}$$

Using this simplified notation, it is easier to see how the Implicit Trapezoidal numerical method will be implemented to advance through values of the capacitor voltage:

$$v_n \approx v_{n-1} + \frac{h}{2}(v'_{n-1} + v'_n)$$

Substituting the derivative for v, as defined in the non-linear differential equation of the simplified vacuum tube model, into the above expression gives us the difference equation that describes the dynamics of the sampled capacitor voltage, $v_n$:

$$v_n \approx v_{n-1} + \frac{h}{2RC}[y_{n-1} - v_{n-1} + f(x_n - kv_n) - v_n]$$

Here we can introduce a new parameter, $$\alpha = \frac{h}{2RC}$$

to further simplify the equation above and express $v_n$ explicitly:

$$v_n \approx \left(\frac{1-\alpha}{1+\alpha}\right)v_{n-1} + \left(\frac{\alpha}{1+\alpha}\right)y_{n-1} + \left(\frac{\alpha}{1+\alpha}\right)f(x_n - kv_n)$$

Again, if the function, $f$, were a linear function of x and v, then the difference equation above would represent a simple IIR filter and its implementation would follow directly. But, since the function, $f$, is not linear in the case of the tube model being considered, we need to perform some form of root solving during each sampling interval to solve for $v_n$. Fortunately, the simplified vacuum tube model implemented here defines the function, $f$, in a way that not only makes the computation of f itself simple, but also allows for a root solving method in the Implicit Trapezoidal numerical integration that is easy to compute as well. Some further simplifications will facilitate the description of this process.

Since $v_{n-1}$ and $y_{n-1}$ are known at the outset of the calculation of $v_n$, it is helpful to group them within constants, $C_1$ and $C_2$, used in the calculations during the step interval:

$$C_1 = \left(\frac{1-\alpha}{1+\alpha}\right)v_{n-1} + \left(\frac{\alpha}{1+\alpha}\right)y_{n-1}$$

$$C_2 = \left(\frac{\alpha}{1+\alpha}\right)$$

$C_1$ is not exactly constant during the course of the entire simulation and changes value from sample to sample. But, it is helpful to treat it as a constant during each step interval to help simplify the expressions in the root-finding process that follows. In particular, the introduction of these constants simplifies the expression for $v_n$:

$$v_n \approx C_1 + C_2 f(x_n - kv_n)$$

Figure 3A:
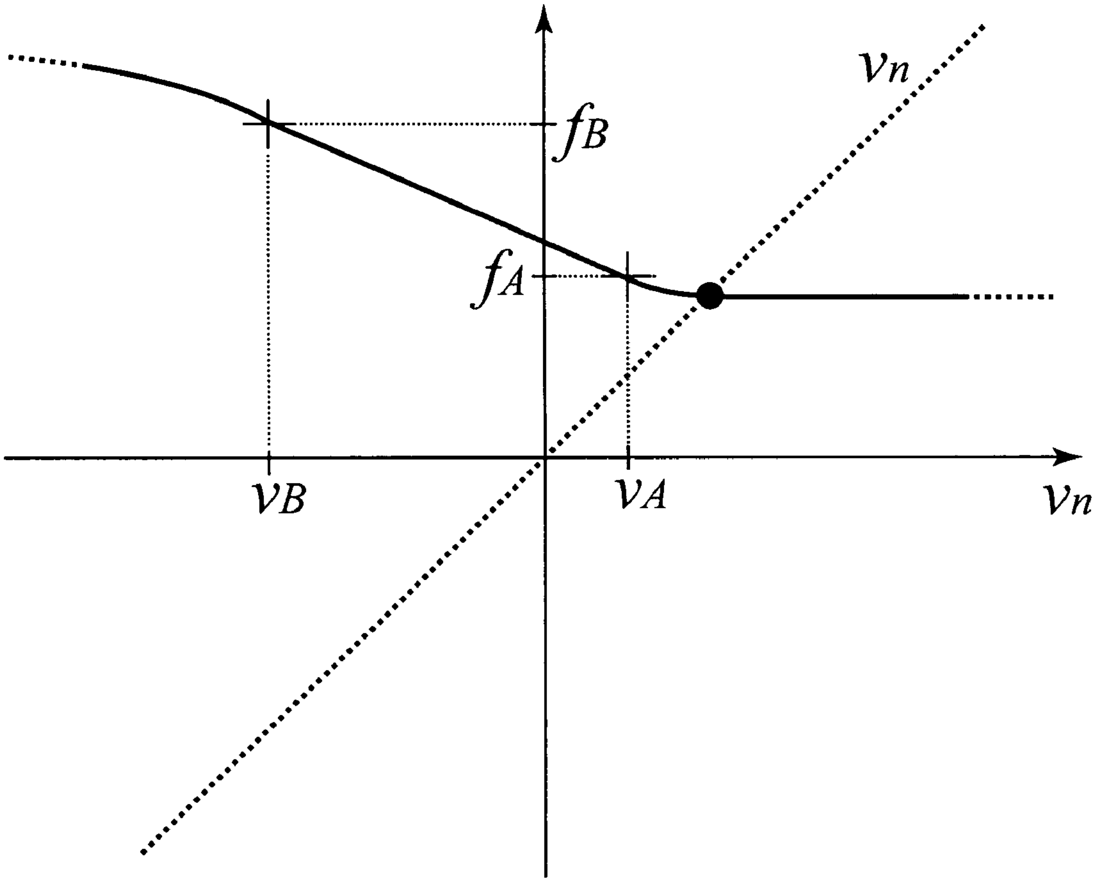
FIG. 3A is a graph of the first of three possible solutions to an implicit trapezoidal numerical integration solver to a non-linear filter representing a model of a vacuum tube amplification stage.
Figure 3B:
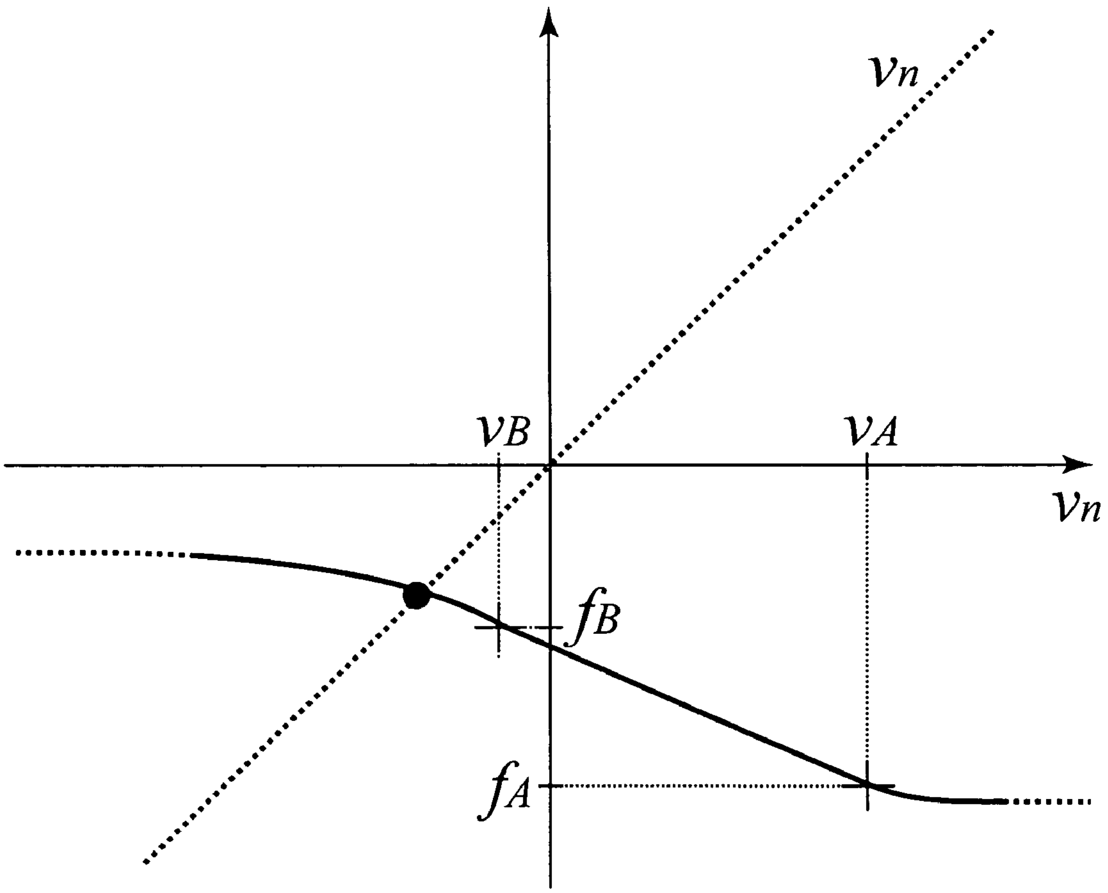
FIG. 3B is a graph of the second of three possible solutions to an implicit trapezoidal numerical integration solver to a non-linear filter representing a model of a vacuum tube amplification stage.
Figure 3C:
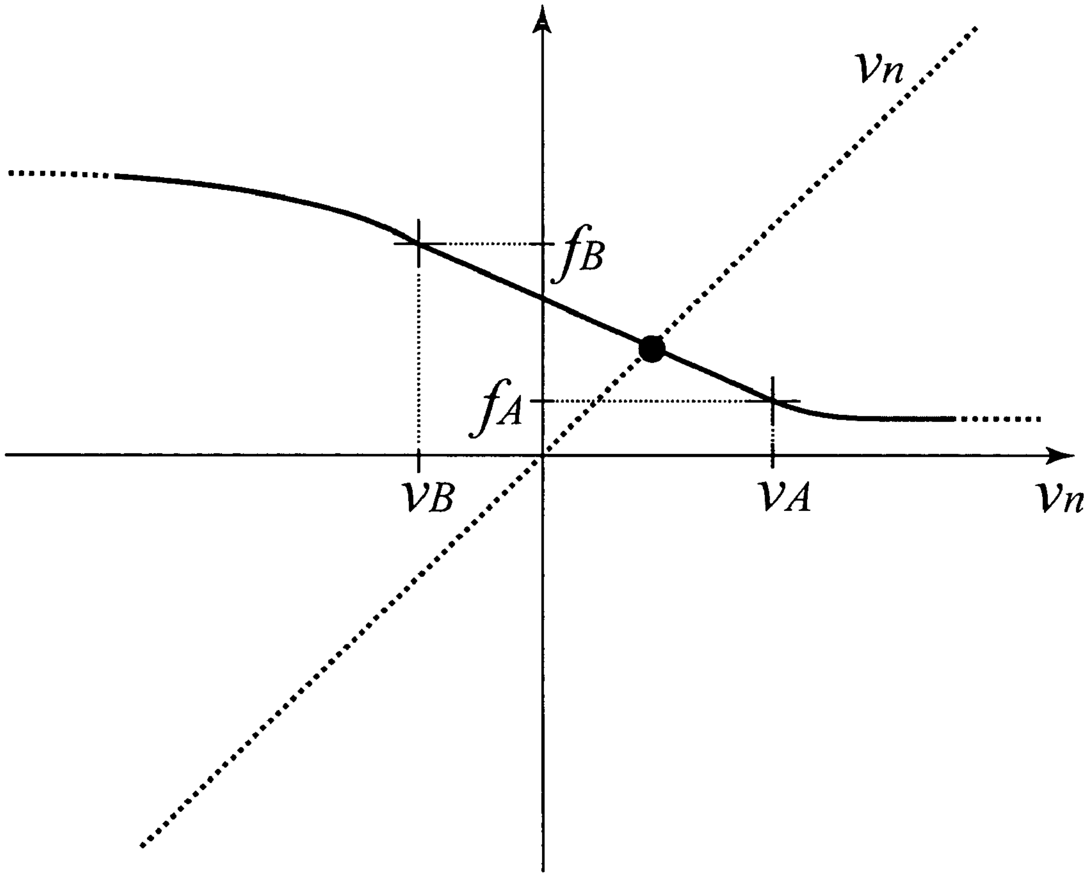
FIG. 3C is a graph of the third of three possible solutions to an implicit trapezoidal numerical integration solver to a non-linear filter representing a model of a vacuum tube amplification stage.

During each sample interval, it is necessary to solve the expression above for $v_n$. To visualize this process, it is helpful to plot both sides of this expression on the same graph with $v_n$ as the domain. Examples of this are depicted in FIG. 3A, FIG. 3B, and FIG. 3C. The left-hand side equation is simply $v_n$, a line with unity slope passing through the origin. The right-hand side equation is the non-linear transfer characteristic function, $f$, reversed, scaled, and shifted by $C_1$, $C_2$, $x_n$, and k. Finding the point where these two curves intersect determines the solution for $v_n$. Because $x_n$ and $C_1$ change from sample to sample, the scale and position of the right-hand side equation will also change. During each sample interval, however, the two curves are fixed and a solution can be found easily.

Since the right-hand side equation is defined piecewise over three intervals, the first step in finding the solution for $v_n$ is to determine in which of these three intervals the intersection takes place. Examining the definition of the non-linear transfer characteristic curve, f, we recall that it is described piecewise on three intervals. Likewise, $f(x_n - kv_n)$ is also described on three similar intervals by substitution as follows:

$$f(x) = \begin{cases} \frac{(k_1 + gx_n - gkv_n)}{(k_2 - gx_n + gkv_n)} - o, & (x_n - kv_n) < \frac{a}{g} \\ gx_n - gkv_n + d - o, & \frac{a}{g} \le (x_n - kv_n) \le \frac{b}{g} \\ \frac{(gx_n - gkv_n - k_3)}{(gx_n - gkv_n + k_4)} - o, & \frac{b}{g} < (x_n - kv_n) \end{cases}$$

It is helpful here to define $v_A$ and $v_B$ as the domain values for the endpoints of these three intervals, and to define $f_A$ and $f_B$ to be the respective values of the right-hand side function at these points. The part of the right-hand side curve for $v_n > v_A$ will be called the "A-section", the part for $v_n < v_B$ will be called the "B-section", and the middle part for which $v_B < v_n < v_A$ will be called the "Linear-section".

Now, if the endpoint of the "A-section" lies above the line of unity slope, as the example of FIG. 3A depicts, then the intersection certainly occurs somewhere inside the "A-section" interval. This implies that $$f_A > v_A$$

Likewise, if the endpoint of the "B-section" lies below the line of unity slope, as shown in the example of FIG. 3B, then the intersection certainly occurs somewhere inside the "B-section" interval, implying that $$f_B < v_B$$

If neither of these conditions are true, meaning that both the endpoint of the "A-section" is below the intersecting line and the endpoint of the "B-section" is above the intersecting line, then the point of intersection must occur between $v_B$ and $v_A$ in the "Linear-section" interval, as is detailed by the example of FIG. 3C. Evaluation of these inequalities will determine the interval in which the intersection occurs.

Computing values for the endpoints is made by rearranging the conditions of the non-linear transfer characteristic curve to express $v_n$ explicitly. The intervals of $f(x_n - kv_n)$ are defined as $$(x_n - kv_n) < \frac{a}{g}$$

$$\frac{a}{g} \le (x_n - kv_n) \le \frac{b}{g}$$

-continued $$\frac{b}{g} < (x_n - kv_n)$$

which are rearranged to find $v_A$ and $v_B$:

$$(x_n - kv_A) = \frac{a}{g} \Rightarrow v_A = \left(\frac{x_n}{k} - \frac{a}{gk}\right)$$

$$(x_n - kv_B) = \frac{b}{g} \Rightarrow v_B = \left(\frac{x_n}{k} - \frac{b}{gk}\right)$$

The values of the function at these endpoints are found most easily by evaluating the "Linear-section" at $v_A$ and $v_B$:

$$\begin{aligned} f_A &= C_1 + C_2 f(x_n - kv_A) \\ &= C_1 + C_2(gx_n - gkv_A + d - o) \\ f_B &= C_1 + C_2 f(x_n - kv_B) \\ &= C_1 + C_2(gx_n - gkv_B + d - o) \end{aligned}$$

which after substitutions simplify to:

$$f_A = C_1 + C_2(a + d - o)$$

$$f_B = C_1 + C_2(b + d - o)$$

With numerical values for $f_A$, $f_B$, $v_A$, and $v_B$, the interval in which the intersection takes place can be determined. If $$f_B < v_B$$

then the intersection occurs in the "B-section". Otherwise, if $$f_A > v_A$$

then the intersection occurs in the "A-section". If neither of these conditions are true then the intersection occurs in the "Linear-section". From these inequalities, the region of intersection is found and the corresponding piecewise equation for $f$ is then solved for $v_n$.

For the case where the intersection occurs in the "A-section", the following equation is solved for $v_n$:

$$v_n = C_1 + C_2\left(\frac{k_1 + gx_n - gkv_n}{k_2 - gx_n + gkv_n} - o\right)$$

which, after manipulation, becomes a quadratic in $v_n$:

$$(gk)v_n^2 + [k_2 - gx_n - C_1 gk + C_2 gk(1 + o)]v_n + [C_1 gx_n - C_1 k_2 - C_2 k_1 + C_2 k_2 o - C_2 gx_n(1 + o)] = 0$$

Applying the quadratic formula, $$v_n = \frac{-B \pm \sqrt{B^2 - 4AC}}{2A}$$

where $$A = gk$$

$$B = k_2 - gx_n - C_1 gk + C_2 gk(1 + o)$$

-continued $$C = C_1 gx_n - C_1 k_2 - C_2 k_1 + C_2 k_2 o - C_2 gx_n(1 + o)$$

the solution for $v_n$ is obtained. In fact, only the positive root marks the desired solution for $v_n$. The negative root represents an intersection outside the interval defined for the "A-section" and should be ignored.

Similarly, for the case of intersection within the "B-section", we utilize the following equation to solve for $v_n$:

$$v_n = C_1 + C_2\left(\frac{gx_n - gkv_n - k_3}{gx_n + gkv_n + k_4} - o\right)$$

which also becomes a quadratic in $v_n$, after some manipulation. Again, the solution is found using the quadratic formula with the following values for A, B, and C:

$$A = -gk$$

$$B = k_4 + gx_n + C_1 gk + C_2 gk(1 - o)$$

$$C = -C_1 gx_n - C_1 k_4 + C_2 k_3 + C_2 k_4 o - C_2 gx_n(1 - o)$$

In this case, however, only the negative root represents the solution. The positive root now lies outside the defined interval for the "B-section" and is ignored.

Lastly, in the case when the intersection lies in the "Linear-section", we solve the following for $v_n$:

$$v_n = C_1 + C_2(gx_n - gkv_n + d - o)$$

which simplifies to $$v_n = \frac{C_1 + C_2 gx_n + C_2 d - C_2 o}{1 + C_2 gk}$$

With $v_n$ now computed, $y_n$ is found directly by the evaluation of $f(x_n - kv_n)$ and is used both as the output sample, and for the value of $y_{n-1}$ in the subsequent sampling interval.

This step-method can be repeated as often as is needed for each sample of the input stream to produce a stream of corresponding outputs. The method is very accurate, much less demanding than other numerical solvers, and is guaranteed to be stable. Overall, this approach is well matched to the demands of digital audio emulation of distortion and vacuum tube devices, producing accurate and stable results at acceptable levels of computational cost and complexity.

Figure 4:
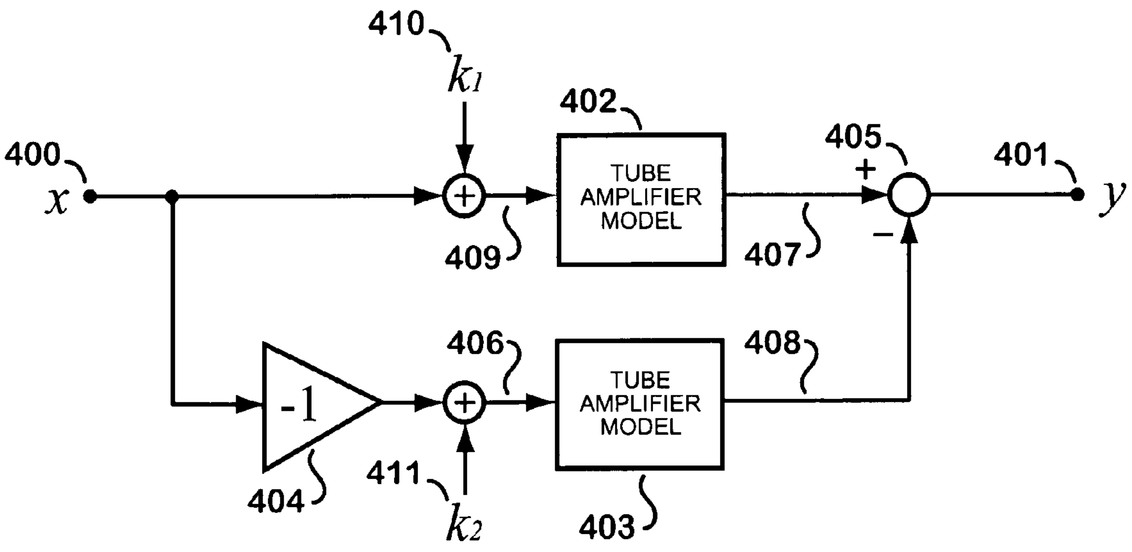
FIG. 4 is a signal flow block diagram of two vacuum tube model blocks connected in a push-pull power amplifier arrangement.

In addition to single tube stages and distortion effects, it may be necessary to emulate the effects of tube power amplification stages in push-pull configurations. This is readily accomplished by using a pair of tube models to process the in-phase and inverted-phase components independently, and combining their outputs appropriately. Referring to FIG. 4, a signal flow diagram of two vacuum tube models wired in a push-pull configuration is shown. The input signal 400 feeds a phase inverter 404 to produce two signals, the in-phase input 409 and the inverted-phase input 406, driving the inputs of the in-phase tube model 402 and inverted-phase tube model 403, respectively. The output signal 401 is then taken as the difference 405 in the output 407 of the in-phase tube model 402 and the output 408 of the inverted-phase tube model 403. As the input signal 400 increases, the input of the in-phase tube model 402 increases while the input of the inverted-phase tube model 403 decreases, and, likewise, the output 407 of the in-phase tube model 402 increases while the output 408 of the inverted-phase tube model 403 decreases. For large positive values of the input signal 400, the inverted-phase tube model 403 is cutoff and only the in-phase tube model 402 contributes to the output signal 401. Similarly, for large negative values of the input signal 400, the in-phase tube model 402 is cutoff and only the inverted-phase tube model 403 contributes to the output signal 401. For small input signals, however, both tube models can be either cutoff or conducting, depending on the values of their respective bias threshold parameters 410, 411. The choice of these bias threshold parameters 410, 411 affects the transfer functions of both tubes and determines the linearity and crossover distortion of their combined output for small signals. The selection of the bias threshold parameters, $k_1$ 410 and $k_2$ 411, will affect the nature of the overall output transfer function near the origin and will decide if the output experiences crossover distortion.

Figure 5:
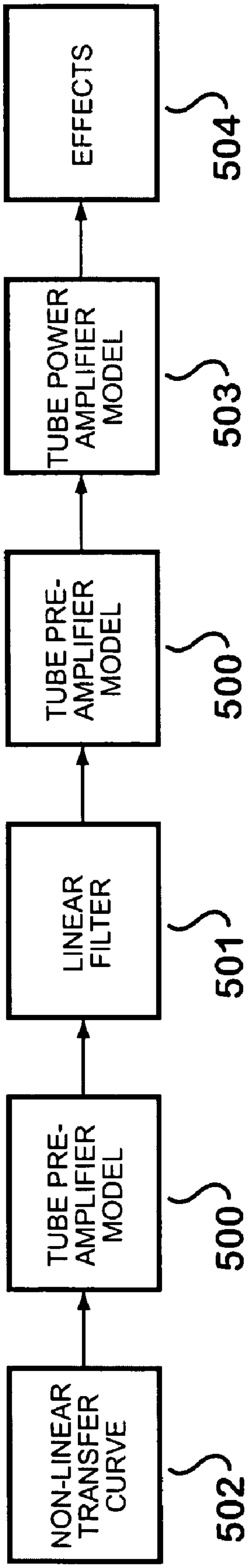
FIG. 5 is a signal flow block diagram of a plurality of vacuum tube model blocks, filters, and effects.

Referring to FIG. 5, a signal flow block diagram depicting a plurality of tube amplifier stage models 500, linear filters 501, non-linear transfer functions 502, tube power amplifier models 503, and other effect stages 504, is shown. In the present invention, several instances of tube amplifier and power amplifier stages may be used in conjunction with linear filters and other effects well known in the art to fully emulate distortion effects, tube amplification and guitar amplification systems. One of the main purposes of the parametric approach to modeling tube amplifier stages is ultimately to enable the parametric control of a full tube amplification system, comprising said stages and other effects. This gives musicians, recording engineers, and others the ability to configure and rearrange these components to emulate any tube amplifier they desire with ease.

There has been described and illustrated herein, a digital signal processing method for tube amplifier emulation. The method of the invention provides a means to emulate the distortion and dynamic characteristics of tube preamplifiers and tube power amplifiers in software running on a computer or other signal processing hardware. Transfer functions of tube preamplifier stages and tube power amplifiers have been described, along with means to use them in non-linear filters and differential equations. Methods of emulating these filters and equations have been presented and a plurality of these methods has been shown to provide a parametrically-controlled emulation of distortion effects, tube amplification and guitar amplification systems. It is to be understood that the invention is not limited to the illustrated and described forms and embodiments contained herein. It will be apparent to those skilled in the art that various changes using different configurations and functionally equivalent components and programming may be made without departing from the scope of the invention. Thus, the invention is not considered limited to what is shown in the drawings and described in the specification and all such alternate embodiments are intended to be included in the scope of this invention as set forth in the following claims.

What is claimed is:

1. A digital power vacuum tube amplifier emulator comprising:

a system input;

a feedback signal;

an input sample resulting from subtracting the said feedback signal from said system input;

an output sample;

a digital sample processor;

a first comparison function to determine if the said input sample is greater or less than a first threshold value;

a second comparison function to determine if the said input sample is greater or less than a second threshold value;

a negative clipping function to produce a negative clipping sample by dividing a first numerator sample by a first denominator sample, the said first numerator sample produced by adding the said input sample to a first coefficient, and the said first denominator sample produced by subtracting the said input sample from a second coefficient;

a positive clipping function to produce a positive clipping sample by dividing a second numerator sample by a second denominator sample, the said second numerator sample produced by adding the said input sample to a third coefficient, and the said second denominator sample produced by adding the said input sample to a fourth coefficient;

a linear function to produce a linear sample by multiplying the said input sample by a gain coefficient;

an output sample selector to select the said output sample, the said output sample selector selecting the said negative clipping sample when the said input sample is less than the said first threshold value, the said output sample selector selecting the said positive clipping sample when the said input sample is greater than the said second threshold value, and the said output sample selector selecting the said linear sample when the said input sample is both greater than the said first threshold value and less than the said second threshold value;

a system output resulting from the said output sample;

a feedback network comprising a linear filter, producing said feedback signal by filtering said system output;

an implicit numerical integration solver function to compute said system output from said system input.

2. The digital power vacuum tube amplifier in claim 1, wherein said implicit numerical integration solver function is an implicit trapezoidal numerical integration method.

* * * * *